United States Patent [19]
Boger et al.

[11] Patent Number: 5,720,820
[45] Date of Patent: *Feb. 24, 1998

[54] APPARATUS FOR APPLYING CONFORMAL COATINGS TO ELECTRONIC CIRCUIT BOARDS

[75] Inventors: Bentley Boger, Atlanta, Ga.; Jurgen Benecke, Brandenburger, Germany; Arthur Cieplik, Luneburg, Germany; Thomas Burmester, Bleckede, Germany; Michael L. Gill, Westlake, Ohio

[73] Assignee: Nordson Corporation, Westlake, Ohio

[*] Notice: The portion of the term of this patent subsequent to Oct. 11, 2014, has been disclaimed.

[21] Appl. No.: 388,138

[22] Filed: Feb. 13, 1995

Related U.S. Application Data

[62] Division of Ser. No. 259,818, Jun. 15, 1994, Pat. No. 5,409,733, which is a continuation of Ser. No. 910,782, Jul. 8, 1992, abandoned.

[51] Int. Cl.⁶ .................................................. B05C 11/00
[52] U.S. Cl. .......................... 118/669; 118/315; 118/411
[58] Field of Search .......................... 118/410, 58, 411, 118/63, 324, 315, DIG. 4, DIG. 2, 677, 669, 696; 239/568, 597, 8, 420, 423, 433; 427/96, 421, 422, 424, 420; 425/461

[56] References Cited

U.S. PATENT DOCUMENTS

| | | | |
|---|---|---|---|
| 3,802,387 | 4/1974 | Perry et al. | 118/DIG. 4 |
| 4,075,976 | 2/1978 | Clayton | 118/324 |
| 4,128,667 | 12/1978 | Timson | 118/68 |
| 4,408,562 | 10/1983 | DeCamp et al. | 118/324 |
| 4,774,109 | 9/1988 | Hadzimihalis et al. | 118/410 |
| 5,354,378 | 10/1994 | Hauser et al. | 118/320 |

*Primary Examiner*—Brenda A. Lamb
*Attorney, Agent, or Firm*—Wood, Herron & Evans L.L.P.

[57] ABSTRACT

Apparatus for producing intermittent, discrete patterns of coating material onto discrete irregular substrate areas, such as electronic circuit boards, where the patterns have sharp, square leading and trailing edges, as well as side edges. A slot nozzle die has elongated air slots along the slot extrusion opening. In the operation of the apparatus, the air flow is initiated from both air slots prior to the initiation of the coating material flow. Also, the air flow is continued beyond that point in time, when the coating material flow ceases. The delays between the operations of the air flow and the hot melt flow are on the order of micro seconds. Alternatively, the lead and lag air start and stop times on each side of the film of coating material are different to control the exact disposition of the square cut-on and square cut-off coating edge on the circuit board. The air flow carries the film coating material to the circuit board for deposition in discrete areas thereon. The sharp cut-on and cut-off accommodate multiple discrete area coating or multiple automated circuit board coating. Methods are disclosed.

9 Claims, 5 Drawing Sheets

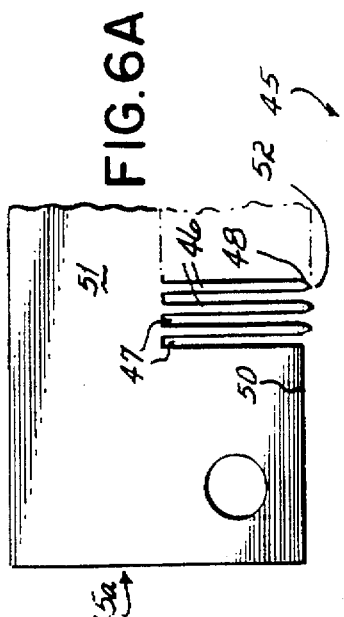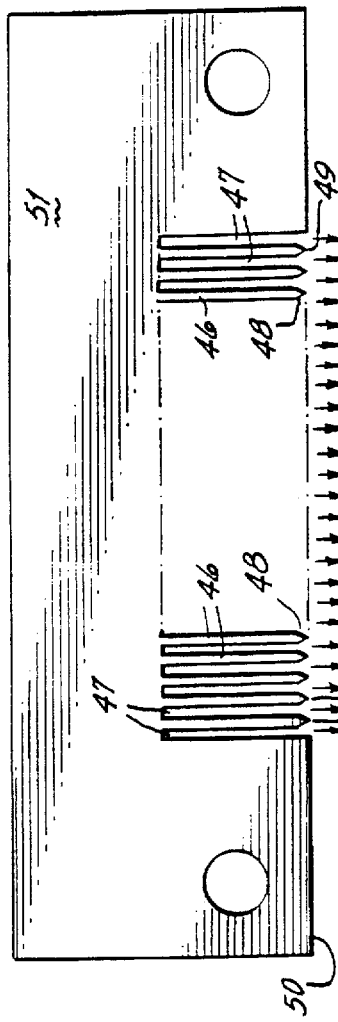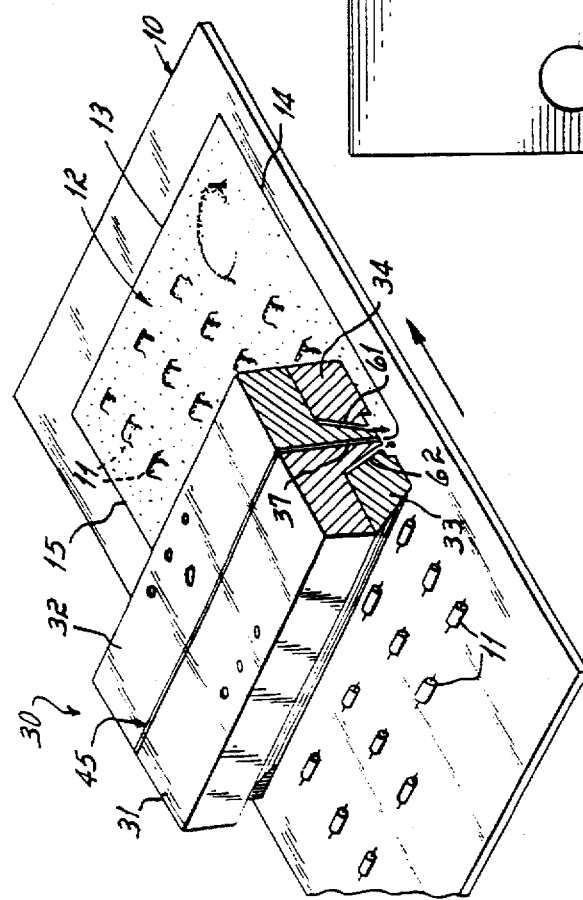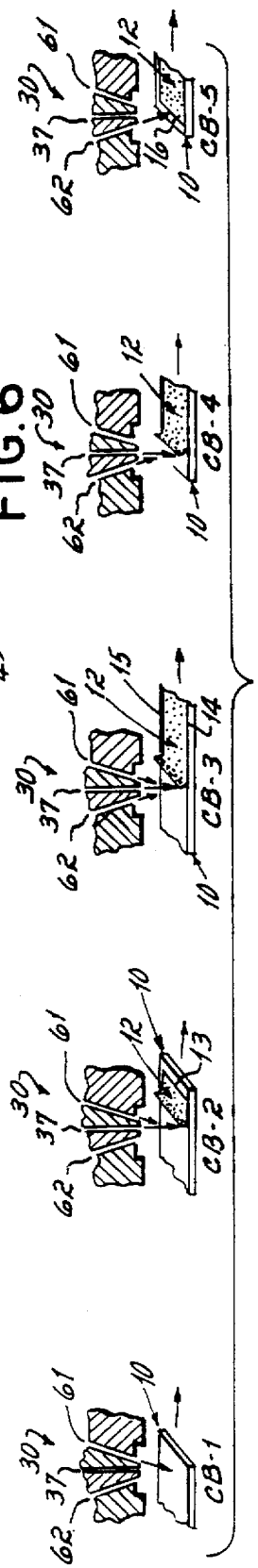

APPARATUS FOR APPLYING CONFORMAL COATINGS TO ELECTRONIC CIRCUIT BOARDS

This application is a divisional of application Ser. No. 08/259,818, filed Jun. 15, 1994, now U.S. Pat. No. 5,409,733, which is a continuation of U.S. Ser. No. 07/910,782 filed on Jul. 8, 1992, now abandoned.

This case is generally related to the following United States Patent Applications filed on Jul. 8, 1992.

| Title | Inventors |
|---|---|
| Apparatus & Methods for Applying Discrete Coating Ser. No. 07/910,781, now abandoned | J. Benecke; A. Cieplik; T. Burmester |
| Segmented Slot Die for Air Spray of Fibers Ser. No. 07/910,784, now U.S. Pat. No. 5,421,921 | M. Gill; J. Benecke; A. Cieplick; T. Burmester |
| Apparatus & Methods for Applying Discrete Foam Coatings Ser. No. 07/910,768, now abandoned | J. Raterman; J. Benecke; A. Cieplik; T. Burmester; M. Gill |
| Apparatus & Methods for Applying Coatins to Bottles Ser No. 07/910,686, now U.S. Pat. No. 5,354,378 | L. Hauser; J. Benecke; A. Cieplik; T. Burmester; M. Gill; K. Washington; R. Evans |
| Apparatus & Methods for Intermitently Applying Discrete Adhesive Coatings Ser. No. 07/911,674, now U.S. Pat. No. 5,418,009 | R. Raterman; J. Benecke; A. Cieplik; T. Burmester; M. Gill |

Such applications are all commonly assigned and are expressly incorporated herein by reference.

This invention relates to the application of moistureproof, insulating coatings to electronic circuit boards, and more particularly to apparatus and methods for carrying out such coatings by application of discrete uniform coatings having sharp, square, cut-on and cut-off edges.

Many industrial applications require the use of discrete, well defined and uniform coatings applied to predetermined areas. Such coatings are very useful in varied processes, such as conformal coatings on non-uniform or irregular substrates like electronic circuit boards.

In the production of discrete coatings for application to discrete substrate areas, for example, it is desirable to obtain broad, uniform coatings in a non-contact application process with sharp, square, cut-on and cut-off edges with no stringing of material. None of the processes currently known are entirely suitable for this application.

In the manufacture of printed circuit boards, a moistureproof insulator film is applied to protect the circuit boards from moisture, electric leakage and dust. Preferably, the moistureproof insulator films are known as conformal coatings, such as acrylic, polyurethane, or epoxy synthetic resins dissolved in a volatile solvent. One conformal coating found satisfactory is available from Humiseal Division, Columbia Chase Corp., Woodside, N.Y., under the trademark "HumiSeal 1B31". When applied to clean printed circuit boards, an insulative resin film of uniform thickness, without pinholes is formed from this material as the solvent evaporates on a continuous basis. Other materials can also be suitable.

In the past, five principal methods have been used to apply coatings of moistureproof insulators to printed circuit boards. These included the following:

a) the immersion method, in which packaged circuit boards are immersed in an immersion tank containing the moistureproof insulator;

b) the brush-coating method, in which the moistureproof insulator is applied by a brush to the printed circuit board surface to be coated;

c) the roller method, in which a sheep's wool roll impregnated with the moistureproof insulator is rolled on the surface of the printed circuit board to thereby provide the insulative coating thereon;

d) the spray method, in which the moistureproof insulator is applied to the printed circuit board by spraying techniques; and e) the slit die method, in which the moistureproof insulator is pressurized and extruded from a slit die to eject a film for coating the printed circuit board surface.

Advantages and disadvantages of these methods are set out in U.S. Pat. No. 4,752,819 and in U.S. Pat. No. 4,880,663, each of which are expressly incorporated herein by reference.

More particularly, the spraying method is advantageous in that it is a simple method to apply a uniform film in an automated method suitable for mass production. Its inherent disadvantages include: the fact it is uneconomical due to poor yield for entire surface coating; blocking of certain components by others resulting in non-coated components; requirement of masking for areas to be free of coating; the expense of workplace environmental protection measures for solvents; and in prior embodiments splashing of sprayed coatings onto parts not to be coated.

Such prior systems generally include a coating applicator or spray gun mounted on a robot arm, for example, to move the gun in predetermined directions over the printed circuit board for deposition of the coating. One such apparatus is described in pending U.S. patent application Ser. No. 07/510,001 filed Apr. 17, 1990, entitled "SPRAY GUN WITH FIVE AXIS MOVEMENT" and owned by assignee of this application. Other related apparatus is described in pending U.S. patent application Ser. No. 07/659,855, filed Feb. 22, 1991, entitled "CIRCUIT BOARD COATING METHOD AND APPARATUS WITH INVERTING PALLET SHUTTLE", also owned by assignee of this application. Such pending applications, Ser. No. 07/510,001 and Ser. No. 07/659,855, are herewith expressly incorporated herein by reference as background information.

Alternatively, the boards are moved in a predetermined manner beneath the applicator, or the boards and guns are each moved relative to the other in a predetermined manner for coating.

In the slit die method, a moistureproof insulator is pressurized and extruded from a slit die to eject a film for coating. If required, air pressure is applied from above the film. Advantages of the slit die method include the provision of wide coating films, relative to the spraying method, and the possibility of automation suitable for mass production. Disadvantages include: variation in the coating thickness deposited and attendant coating film breakage; necking or drawing in at the film edges, causing "railroading" or thickened film edges and non-uniform coatings; and the requirement of masking for areas to be free of coating.

While not related to conformal coatings for circuit boards, one technique used for producing fibers and non-woven webs is known as a melt-blowing process. One such example of the melt-blowing process described in U.S. Pat. No. 4,720,252. In that device, hot melt thermoplastic material is extruded from a continuous slot opening and air is blown onto the extruding material from both sides of the slot opening to produce the desired webs. Such processes are used for web production or article build up, and do not generally concern themselves with intermittent operation to produce discrete coatings.

The disclosures in the aforesaid U.S. Pat. Nos. 4,880,663 and 4,753,819 are directed to apparatus for applying conformal coatings to circuit boards without certain of these disadvantages. Yet, it is desired to apply conformal coatings to electronic circuit boards in a manner including the advantages of both the spraying and slit die methods noted above and without the attendant noted disadvantages of either method.

Accordingly, it has been an objective of this invention to provide methods and apparatus by which conformal coatings can be applied to circuit boards in a non-contact manner, without masking or splashing, and with sharp, square cut-on and cut-off leading and trailing coating edges with no stringing.

A still further objective of the invention has been to provide improved methods and apparatus for generating discrete, sharp, square edges conformal coatings on irregular substrates such as electronic circuit boards.

To these ends, a preferred embodiment of the invention contemplates application of a conformal coating to electronic circuit boards by means of an elongated slot nozzle die having an elongated slot outlet for generating a film of coating material and parallel air slot openings juxtaposed to the slot outlet for blowing air onto the exuding film and controlling the coating to produce in it, as deposited, square, sharp edges with no stringing. In one mode, the air start-up on both sides precedes extrusion start-up and continues until after the extrusion is stopped. In another mode, the air on one side of the nozzle is started before extrusion is started and terminates before extrusion is stopped while air on another side of the nozzle starts after extrusion start-up and continues until after extrusion stops. This aids in accurately placing or indexing the sharp, square, leading and trailing edges of the coating.

Continuation of air flow after extrusion stoppage can draw coating material remaining at or in the nozzle into the air stream and onto a substrate, causing stringing. Accordingly, the delay of air stoppage after extrusion stoppage is predetermined to produce good sharp, square coating pattern cut-off, but not so long as to draw remaining glue at the nozzle therefrom so as to cause stringing. The air start-up and stop delays are preferably on the order of microseconds.

The invention produces uniform, wide or broad coatings having sharp side edges and sharp, square, leading and trailing edges coordinated with a predetermined underlying substrate area and applied in a non-contacting application process.

Due to the sharp cut-on and cut-off, no masking is required. Nor is there any "splashing" of coating material on the circuit board or its components. The air fiberizes the coating material and carries it to precise deposition on the circuit board.

High viscosity and higher temperature polymers can be used, and coating of an impervious film can be accomplished in one pass.

These and other objectives and advantages will become readily apparent from the following detailed description of a preferred embodiment of the invention and from the drawings in which:

BRIEF DESCRIPTION OF THE DRAWINGS

FIG. 1 is a perspective view illustrating application of a conformal coating to an electronic circuit board according to the invention;

FIG. 6 is a front view of the slotted or segmented shim used in the slot nozzle die of the coating apparatus;

FIG. 6A is a partial view of an alternative shim;

FIG. 8 is a diagrammatic view illustrating use of one embodiment of the invention in applying conformal coatings to electronic circuit boards;

DETAILED DESCRIPTION OF THE PREFERRED AND ALTERNATE EMBODIMENTS

Figure 2:
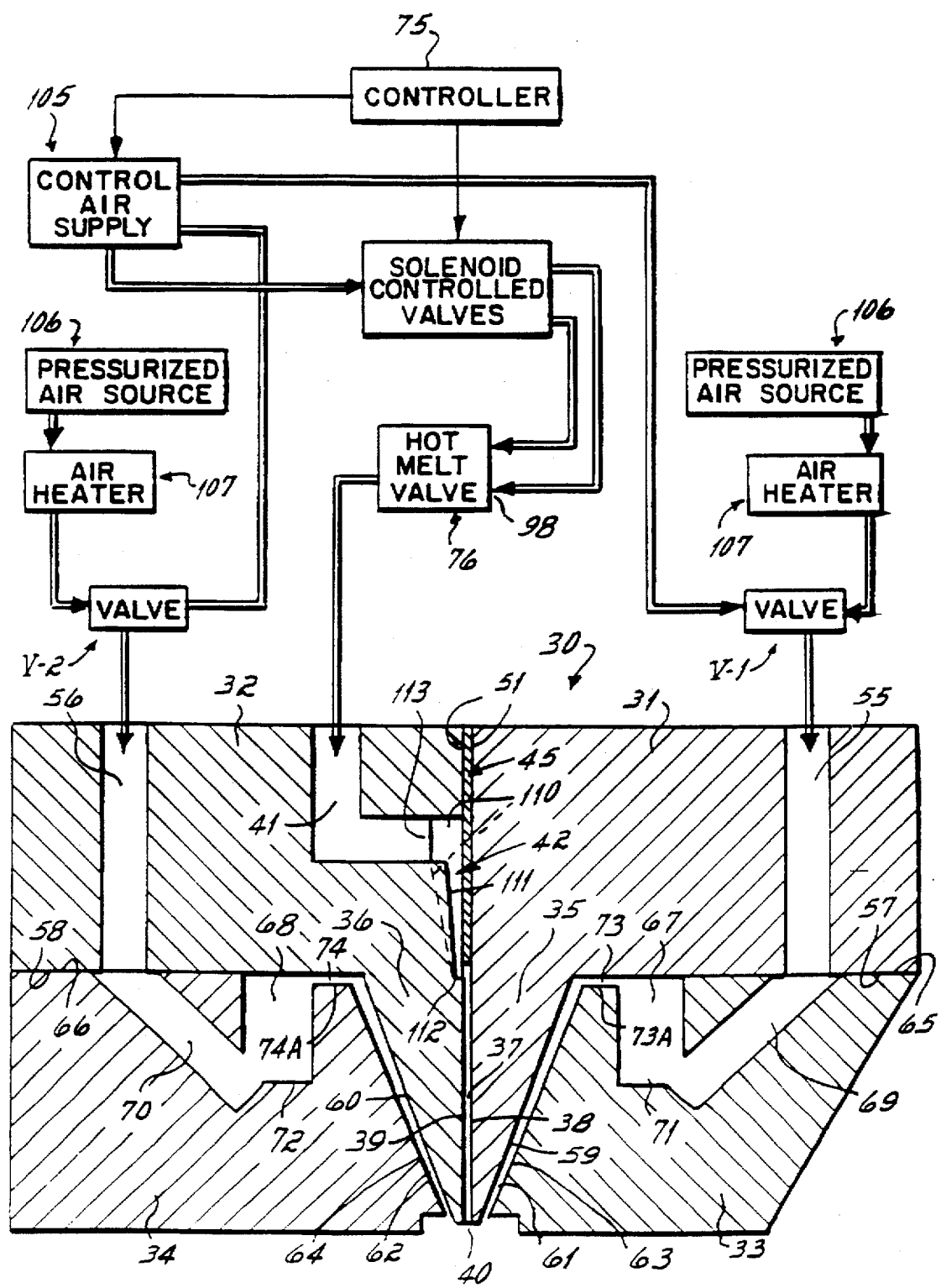
FIG. 2 is a diagrammatic side view in partial cross-section illustrating the coating apparatus of FIG. 1 in more detail.

Turning now to the drawings, and particularly to FIG. 1, there is shown in FIG. 1 an electronic circuit board 10 having components 11 thereon, such that the circuit board 10 and components 11 present an irregular surface for receiving a conformal, moistureproof, insulative coating 12. The insulative coating 12 is applied to the circuit board by means of the slot nozzle die means 30, which will be described hereinafter in detail. The circuit board 10 is passed in the direction of arrow A beneath the slot nozzle die means 30, which produces a film of coating material, such as the conformal coating material mentioned above, for deposition on the circuit board 10. The coating lies over and covers the circuit board 10 and the various components mounted on the circuit board. It will be appreciated that the coating has a leading edge 13, side edges 14 and 15, and trailing edge 16 (FIG. 8) each of which is sharp and square with no stringing. The coating 12 is deposited on a predetermined, discrete area of the circuit board and the trailing edge of the coating may be defined at any predetermined position on the circuit board which, in this case, may be, for example, just beyond the last of the components 11 at the righthand end of the circuit board as viewed in FIG. 1.

There will now be described the apparatus for generating discrete, uniform coatings having sharp, square cut-on and cut-off edges. FIG. 2 illustrates various features of a die means 30 and air and coating material controls according to the invention. The die means 30 comprises two die halves 31, 32, and two air blocks 33, 34. Each die block 31, 32 includes a downwardly depending projection 35, 36. The die halves 31, 32 define between them an extrusion slot 37. Slot 37 is defined by the face 38 of the die half 31 and the face 39 of the die half 32. Face 38 is juxtaposed with respect to the face 39, as shown. The extrusion slot 37 terminates at an elongated slot nozzle or extrusion outlet 40.

As noted in the Figures, the air blocks extend below the outlet 40 to provide a degree of protection from mechanical damage.

Figure 5:
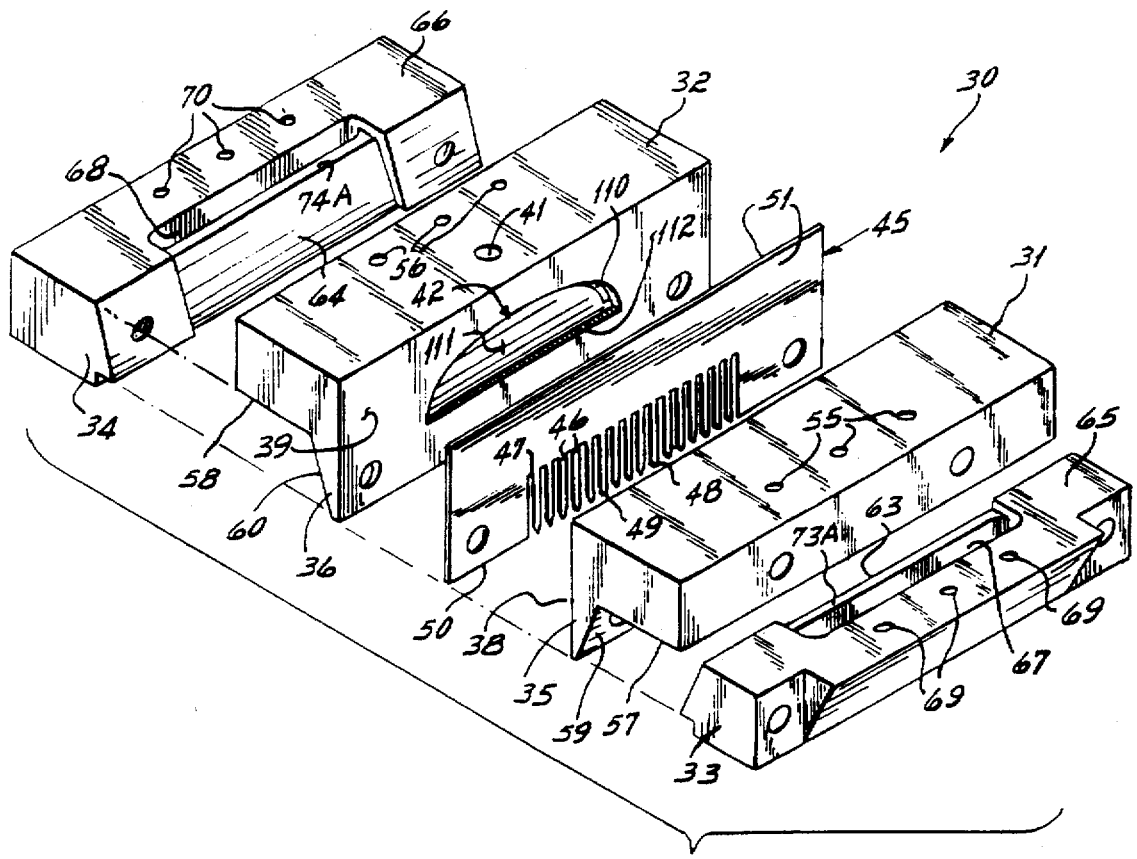
FIG. 5 is an exploded view of the slot nozzle die of FIGS. 1 and 2.

Die half 32 includes a coating material passageway 41 for receiving coating material and conducting the material to a "coat hanger" portion 42 of the die half 32, details of which are perhaps better seen in FIG. 5. A slotted or segmented shim 45, as best seen in FIG. 6, and a portion of which is seen in FIG. 2, is located between the juxtaposed surfaces 38 and 39 of the die halves 31 and 32. The shim 45 has a plurality of elongated projections 46, defining between them a plurality of elongated channels or slots 47.

Each of the projections has a downstream tapered end portion 48, having a tip 49 which is flush with the lower edge 50 of the shim, and short of, flush with, or extending beyond the elongated slot nozzle extrusion outlet 40 (FIG. 2). In FIG. 2, only the top portion 51 of the shim 45 is shown, for the purpose of clarity. Alternatively, an open shim can be used. Also, an alternative shim 45a (FIG. 6A) has pointed tips 52 extending beyond slot outlet 40, preferably two or three thousandths of an inch.

Returning now to FIG. 2, each of the upper die halves 31, 32 is provided with an air passageway 55, 56, extending from an upper surface of the die to a lower respective surface 57, 58. Each die half 31, 32 also includes an inclined surface 59, 60, depending from the surfaces 57 and 58, respectively. The inclined surfaces 59 and 60 define one part of an air passage, or air slot 61 and 62, as will be described.

Turning now to the air blocks 33 and 34, it will be appreciated that each of them include an inclined surface 63 and 64, respectively, which define the other side of the air slots 61 and 62 with the juxtaposed respective surfaces 59, 60, all as shown in FIG. 2. Each of the air blocks 33 and 34 include an upper surface 65, 66 juxtaposed to the respective lower surfaces 57 and 58 of the die halves 31, 32.

Figure 3:
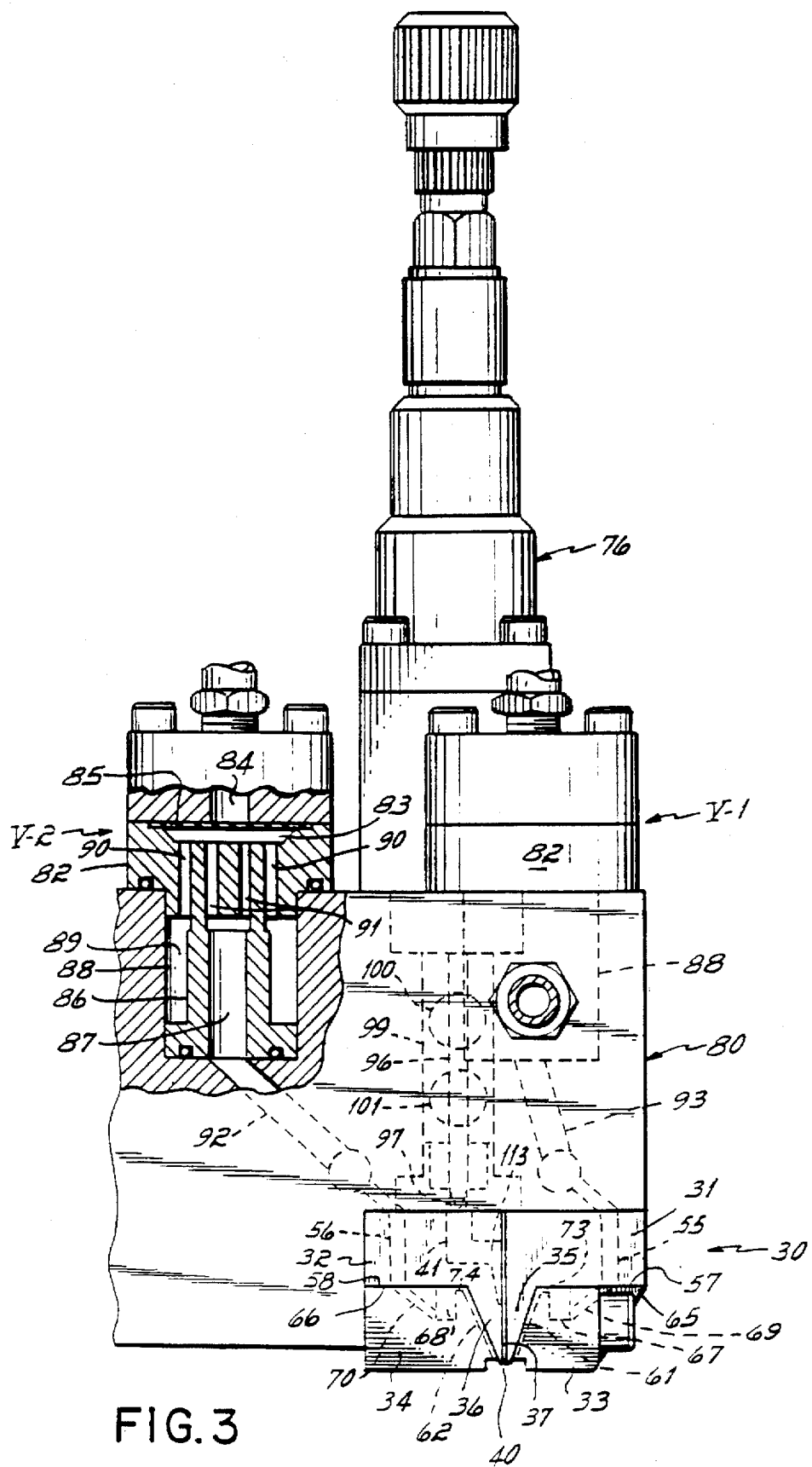
FIG. 3 is an elevational side view in partial cross section of a slot nozzle coater as in FIG. 2.

An elongated air plenum 67, 68 is formed in each of the air blocks 33, 34. The plenums 67, 68 are also seen in FIGS. 3 and 5. Respective air passages 69 and 70 are formed in the respective air blocks 33 and 34 and extend from the respective surfaces 65 and 66 to a lower portion 71, 72 of the respective plenums 67, 68. Each of the plenums 67, 68 are primarily defined in the air blocks 33 and 34. However, when the die means 30 are assembled, the top area of each of the respective plenums 67, 68 are defined respectively by the lower surfaces 57 and 58 of the die halves 31, 32. These surfaces 57, 58 also form an upper portion of air passage 73 and 74, each of which respectively lead from their associated plenums 67 and 68 to the air slots 61 and 62. Accordingly, looking at the right hand side of FIG. 2, it will be appreciated that air can pass through the passageway 55 to the passageway 69 in air block 33, and from there to the plenum 67. "O"-rings, not shown, can be used at the interfaces of the respective die half and air block to seal passages 55, 56 with passages 69, 70, respectively. Pressurized air in the plenum 67 moves through the passageway 73 into the air slot 61.

In a like manner, air can be introduced to passageway 56 in the die half 32 and from there it can move into the air passageway 70 and into the lower portion of the plenum 68. From the plenum 68, pressurized air is directed through the air passage 74 into the air slot 62 of the air block 34.

Referring now briefly to the upper portion of FIG. 2, it will be appreciated that a controller 75 is operationally connected to valves V-1 and V-2, as shown, for controlling the introduction of heated, pressurized air to the passages 55 and 56, respectively, in order to pressurize those passages and the downstream air passages as previously described, with air. At the same time, the controller 75 is operationally interconnected to a coating material valve 76 for controlling the supply of coating material to passage 41 and to the internal coat hanger area 42 of the die means 30.

While any suitable form of controller 75 can be used, as is well known, one particular controller comprises a PC-10 pattern controller, manufactured by Nordson Corporation of Westlake, Ohio. The PC-10 pattern control 75 is operational to initiate and to stop the generation of air into passages 55 and 56, either simultaneously or independently, and also to initiate and to stop the coating material flowing through valve 76 so as to intermittently provide coating material to the passageway 41 independently and at pre-selected times with respect to the provision of pressurized heated air to the passages 55 and 56, all in a manner as will be described.

The air slots 61 and 62 are oriented on an angle with respect to the elongation of the extrusion slot 37. Accordingly, when coating material is extruded through the slot 37 and outwardly of the extrusion outlet 40, air moving through the air slots 61 and 62 is impinged on the material before that material engages or is deposited on an underlying substrate which is presented for coating. Generally, the air carries the film of exuding material onto the circuit board 10. The coating, when a segmented shim is used, coalesces or merges to form an impervious moistureproof insulating coating 12.

Figure 4:
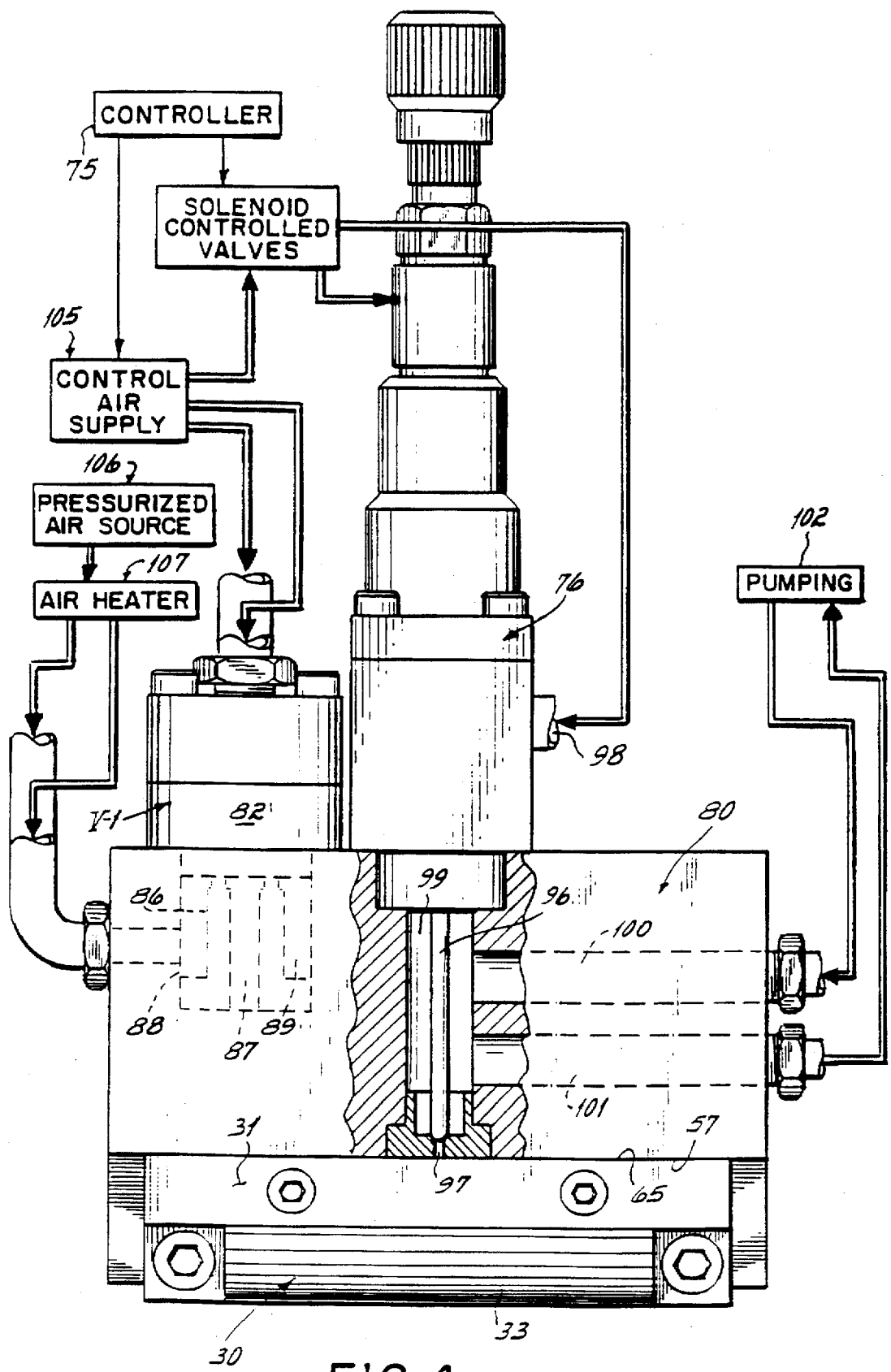
FIG. 4 is an elevational diagrammatic front view in partial cross-section of the apparatus of FIG. 3.

Turning now to FIGS. 3 and 4, there is shown more of the overall extrusion apparatus according to the invention. As shown in FIG. 3, the die means 30 is interconnected with air valves V-1, V-2 and coating material valve 76, each of which is interconnected with an extrusion body 80 which operationally interconnects the air and coating material valves with the die means 30. For clarity, a portion of the air valve V-2 is shown in partial cross section in FIG. 3.

Since the valves V-1 and V-2 are identical, only valve V-2 will be described. Such air valves are manufactured and distributed by Nordson Corporation through Nordson Engineering of Luneburg, Germany, under part number 265701. Any other suitable air valve can be used.

Valve V-2 comprises a valve body 82 defining a valve chamber 83 and a control chamber 84, the two chambers being separated by the diaphragm 85. An extension 86 having a bore 87 extending therethrough depends from the valve body 82 and extends into the bore 88 of extrusion body 80 to form an annular chamber 89 therewith. Chamber 89 is interconnected with an annular passageway 90 in the valve body 82, which interconnects with the chamber 83. An annular chamber 91 is also defined in the valve body 82 and interconnects with the chamber 83. When control air is directed into chamber 84, the diaphragm 85 is pushed downwardly to seal off the annular passage 90 from the annular passage 91. on the other hand, when pressure is decreased in the control chamber 84, the diaphragm moves upwardly to the position shown in FIG. 3. Air in the inlet annular chamber 89, which is heated and under pressure, communicates through the annular passages 90 through the chamber 83 and the annular passage 91, into the outlet bore 87. Outlet bore 87 is connected through a passageway 92 to the air passage 56 in the upper die half 32, as shown in detail in FIG. 3, where the air from there can move to the plenum 68 and into the air slot 62.

In like manner, the air valve V-1 is operable to selectively supply air to the air passage 93 in the extrusion body 80 and from there to the air passage 55 in the upper die half 31. Air moves through that passageway 55 into the plenum 67 and from there to the air slot 61.

The coating material valve 76 can be any suitable coating material valve which can be selectively controlled to initiate and to cut off the flow of coating material to the die means 30. One such suitable valve is balanced valve model no. EP51 produced by Nordson Corporation of Westlake, Ohio. Such valve minimizes significant change in pressures when the valve is switched between its opened and closed positions. The valve 76 has a stem 96 seated over a port 97. When control air is supplied to an inlet 98, the stem 96 is lifted to permit coating material in a chamber 99 to flow through the port 97 and into the passageway 41 of the upper die half 32. Coating material is introduced into the chamber 99 through inlet 100. An outlet 101 could also be interconnected with the chamber 99 to receive pressurized coating material when the stem 96 is seated on port 97 if it were desired to recirculate coating material.

Any suitable apparatus can be utilized for pumping conformal coating material to the valve 76. Such apparatus is shown diagrammatically at 102, and may comprise any suitable pump, pressure pot or any other suitable device. If it were desired to use some form of hot melt coating material, one particular form of apparatus which is suitable is the model HM640 applicator, manufactured by Nordson Corporation of Westlake, Ohio.

FIGS. 2 and 4 illustrate diagrammatically the various control inputs to the valves 76 and V-1. As shown in FIG. 4, the controller 75 is interconnected to a control air supply 105 for supplying control air to the valves V-1 and V-2. A pressurized air source 106 is interconnected to an air heater 107 which supplies process air to the valves V-1 and V-2 for transmission to the respective air slots 61, 62, as described above. When the respective valves V-1 and V-2 are opened, controller 75 is also interconnected to the control air supply for supplying control air through closed and opened solenoid control valves (FIG. 4) to open and close the valve 76.

Referring now more particularly to FIG. 2 and the details of the die means 30 as shown in FIG. 5, it will be appreciated that the plenums 67 and 68 in the air blocks 33, 34 communicate with the lower surfaces 73A and 74A, respectively, of the air passages 73 and 74 as previously described, and air emanating from the upper portion of the plenums 67 and 68 moves through the passageways 73 and 74 and then downwardly through the respective air slots 61, 62.

Turning now to the so-called "coat hanger" portion 42 of the upper die half 32, and with reference to to FIG. 5, it will be appreciated that "coat hanger" dies are known in general. For example, one coat hanger-type die for handling coating material is disclosed in U.S. Pat. No. 4,687,137, expressly incorporated herein by reference. The difference in that structure is that it serves a plurality of die outlets, and not a continuous extrusion slot die as noted herein. While such a die could be used herein, nevertheless, the present die means 30 incorporates a "coat hanger" portion 42 having an arcuate slot or groove of increasingly shallow dimension 110 communicating with an incline surface 111. Surface 111 is inclined such that its lower portion, where it meets bottom surface 112, is closer to the plane of the face 39 than is the upper portion. It will also be appreciated that slot 110 is of decreasing depth as its distance from port 113 continues until it flows unbroken in surface 111. The arcuate slot 110 of decreasing depth is fed coating material by the port 113, which is interconnected to the passage 41. In use, when coating material is supplied at pressure to the passage 41, it exudes through the port 113 into the arcuate slot 110 and from there flows over the surface 111 and spreads out throughout the relieved coat hanger shaped portion 42 of the die face 39 and the side of the shim 45 which is juxtaposed to the face 39 of the die half 32.

It will be appreciated that the slots 47 of shim 45 have upper ends which communicate with the lower portion of the coat hanger die area 42, just above the surface 112 thereof, so that coating material can flow into the slots 47 and then downwardly to the extrusion outlet 40. In this manner, the coating material is spread throughout the coat hanger portion 42 and across each of the upper ends of the slots 47 of the shim 45 at significantly equal pressures, so that coating material can move through the extrusion slot 37 within the slots 47 of the shim 45 at relatively equal pressures.

As illustrated diagrammatically in FIG. 6, the material exudes through the slots 47 and then outwardly of the extrusion outlet 40.

Considering the advantages of the segmented shim 45, it will be appreciated that the width of the slots 47 between the projections 46 is preferably about twice the thickness of the shim 45. The thickness of one shim 45 may be about 0.004" while the slot width, i.e. from one projection 46 across to the next projection 46, is about 0.008". In another shim 45, for example, the shim thickness is about 0.008" while the segmented slot width between juxtaposed projections is about 0.016"

Accordingly, the overall slot thickness between die faces 38, 39 can be doubled while the die still produces the same basis weight coating as a prior slot die where the die slot is not segmented, as in this invention. Thus in a prior slot die where a slot thickness of 0.002" was needed for a small basis weight coating, the present invention can obtain the same basis weight coating with a slot thickness of 0.004", or doubled. Thus, the slot die according to the invention could pass a potentially clogging particle of 0.003" while the prior continuous slot die would not (for the same basis weight coating to be produced).

While the ratio of the slot width to the shim thickness is preferably about 2 to 1, this ratio can be varied to produce varying coating thicknesses.

It will be appreciated that the width and thickness parameters of the shims 45, 45a and their components can widely vary. The parameters may vary due to the basis weight of coating per square meter desired, the cohesiveness desired, the coating material viscosity or other factors.

In order to provide further description of one form of coat hanger portion 42, the surface 112 from face 39 back to surface 111 is about 0.020" wide. The tops of slots 47 are about 0.050" when the shim is operably disposed between faces 38, 39. The groove 110 at its deepest depth from face 39 is about 0.125" from face 39. The surface 111 at its top area is about 1/16" deep from face 111 and about 0.020" back from surface 39 at its bottom. The coat hanger width across face 39 is about 38 mm.

It will be appreciated that the coating material may be precisely delivered to the heads or nozzles by one or more material metering means such as metering gear pumps. A single pump could feed a manifold for all the heads or nozzles or a separate metering gear pump could be used for each head or nozzle, or for a group of nozzles of less than all nozzles. This precise delivery permits accuracy in the material delivery so that accurate basis weight coatings can be provided for varying substrate speeds, for example. Any suitable form of metering feeds can be utilized. For example, U.S. Pat. Nos. 4,983,109 and 4,891,249, expressly incorporated herein by reference, disclose metering means for hot melt adhesives.

Turning now to the use of the apparatus described above, for the application of coatings to defined predetermined or discrete substrates, it will be appreciated that the apparatus is capable of impinging hot air from the slots 61 and 62 on each side of the coating material exuding from the extrusion outlet 40. The impinging air engages and carries the expanse of coating material onto the circuit boards in the form of a solid, impervious film. Edge control is uniform. The parameters are selected depending on the application to which the coatings are to be applied. The controller 75 is operational to start and stop the application of air to the extruded coating material at different times and/or intervals compared to the starting and stopping of the delivery of coating material to the extrusion outlet 40.

For example, in one preferred method of operation, the flow of air through the slots 61, 62 is started a short time prior to the time when the valve 76 is operated to initiate the delivery of coating material into the slot 37 and out through the outlet 40. The air is continued for the coating deposition. At the end of the deposition period, the valve 76 is first operated to cease the extrusion of coating material through the outlet 40. After a short delay, the flow of air through the slot 61 and 62 is stopped. While the amount of delay in such an operation will vary, depending upon the properties of the coating material, such time period generally will preferably be on the order of micro seconds. One example would be, for example, 1700 micro seconds between the start up of the air and the start up of the extrusion of the coating material, and 2100 micro seconds between the stopping of the coating material and the stopping of the air. Continuation of the air flow much beyond this time might serve to pull off remaining coating material at the extrusion outlet and cause stringing of the deposited coating.

Moreover, it will also be appreciated that the invention contemplates the selective application of air flow through either slot 61 or 62 individually or together during the deposition period, particularly to more accurately define the initial and ending contact position of the deposited coating on the substrate. One such mode of operation is illustrated in FIG. 8, where the apparatus is utilized, for example, to apply a discrete coating 12 to predetermined areas of electronic circuit board 10.

In FIG. 8, a circuit board 10 is shown at the left hand side of the figure at position CB-1. Also, it will be appreciated that a plurality of discrete circuit boards can be moved under die means 30 so that a coating can be applied to each board. It will also be appreciated that positions CB-1 through CB-5 correspond to progressive positions of a circuit board 10 as it moves past a fixed slot die means 30. Alternately, the slot die means 30 could be moved across the circuit board 10.

As illustrated at CB-1, air flow has been initiated through slot 61 but there is no coating material being extruded through the slot 37 and no air flow has started through the air slot 62. Moving to the circuit board 10 at the position CB-2, it will be appreciated that the coating flow has started and that it is impinged by air flowing through slot 61. A sharp, square, leading edge 13 of coating 12 is thus established at a predetermined position on the board 10. Since the air flowing through slot 61 moves downwardly in a general right to left direction as shown in FIG. 5, it will be appreciated that the coating material does not string across the leading edge of board 10 but is applied directly to the board in a square sharp leading edge 13 with no stringing. Thereafter, and for most of the remainder of the coating operation, as shown in position CB-3, air flow is produced through the slot 62. At the end of the coating operation, the air flowing through slot 61 is terminated just before termination of the extrusion of the coating material (position CB-4). Then, as shown in position CB-5, the coating material flow has ceased, while the air flowing through slot 62 continues for a short time period thereafter. This operation, when used in circuit board coating, for example, produces a sharp, square trailing edge 16 and ensures that the adhesive will not string across the rear surfaces of the circuit board, or the leading area of a following board.

Accordingly, with respect to FIG. 8, the lag air is started first and stopped first and the lead air, that is, with respect to the left to right machine direction of the application as shown in FIG. 8, is started after the extrusion of the coating material and stopped after the coating material extrusion has ceased. In this way, the air angling onto the coating material does not blow it in strings over the surface of the circuit board, as would be undesirable, and yet the cut-off and cut-on edges of the coating material are maintained in sharp, square fashion on the board.

It should also be appreciated that as shown, the coating width is provided such that a single pass is sufficient. Narrower coating widths can be provided to cover preselected narrower board systems, for example, by means of a shim 45 change.

In any event, the coatings applied have sharp, well defined side edges with no or only minimal neck-in, uniform coating thickness out to such edges, sharp square leading and trailing edges and no stringing or splashing.

The invention is believed useful with a wide range of coating materials of different viscosities, as shown by the following two examples.

MATERIAL NO. 1:
Supplier:
Dymax Corporation of Torrington, Conn.
Brand:
Dymax 984F
Viscosities:
300 CP
MATERIAL NO. 2:
Supplier:
Emerson and Cuming, Inc. of Woburn, Mass.
Brand:
S-7002 Silicone
Viscosities:
750 CP It is important in the coating operation and other applications that the supply pressure and return pressure be maintained in a relationship, such that the differences of the two pressures are not more than 1 BAR.

Figure 7:
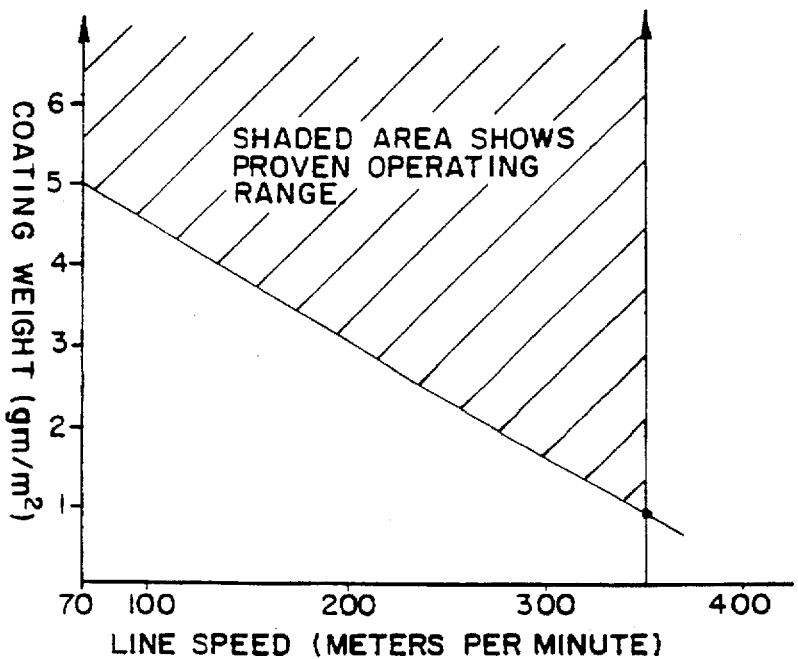
FIG. 7 is a graph illustrating coating weight applied vs. substrate line speed for the coating apparatus.

In addition, it is believed, based on current information, that a minimum flow rate is required to produce a uniform pattern with square and sharp cut-ons and cut-offs. For example, in connection with a 38 millimeter wide pattern, it is possible to get down to at least 1 gram per square meter of coating weight at approximately 350 meters per minute of line speed. The graph in FIG. 7 illustrates coating weights which have been obtained with a 38 millimeter wide pattern deposited on a substrate moving at about from 70 meters per minute to about 350 meters per minute, with the shaded area of the graph (FIG. 7) illustrating the proven operating ranges.

As noted above, conformal coatings are produced in varying weights, but in solid films.

It will be appreciated that various sizes, spacings, pressures and selections of materials can be utilized. Thus, for example, the coating material might be started at 2 mm of substrate movement after air start up, and the air flow stopped at 5 mm of substrate movement beyond extrusion shut off, for substrate speeds of about 70 meters/minute.

It will also be appreciated that while the particular coating pattern produced by the apparatus and methods described above can be porous, or it is preferably impervious for circuit board application, and that the coating patterns are preferably produced in a discrete fashion on discrete substrates, for example, with good, square, sharp cut-on and cut-off and no stringing for the leading or trailing edges of the pattern, while at the same time, the sides of the pattern deposited are also parallel and sharp.

Accordingly, the invention provides for intermittent non-contact coating operation with sharp, square-edged patterns and no stringing for a variety of applications, including conformal coatings on electronic circuit boards. It also allows the application of coating materials having high solid content.

These and other modifications and advantages of the invention will become readily apparent to those of ordinary skill in the art without departing from the scope hereof, and the applicant intends to be bound only by the claims appended hereto.

We claim:

1. Apparatus for producing a conformal coating for application to non-uniform substrates having varied surface contours, said apparatus comprising:

a slot nozzle having an elongated slot outlet through which a conformal coating material can be extruded:

a valve for starting and stopping a flow of conformal coating material to said slot nozzle to produce discrete conformal coatings;

at least one air slot proximate said elongated slot outlet for impinging at least one air stream onto said conformal coating material exuding horizontally from said elongated slot outlet and for carrying said conformal coating material in a film to a non-uniform substrate surface;

a valve for starting the flow of air prior to extrusion of said conformal coating material from said elongated slot outlet;

further including at least two air slots, one proximate each side of said elongated slot outlet for impinging air therefrom onto said conformal coating material exuding from said elongated slot outlet; and further including means for delaying impinging air from one of said air slots until after said conformal coating material extrudes from said elongated slot outlet and for continuing flow of air from said one air slot until after extrusion of said coating material has ceased.

2. Apparatus as in claim 1 further including means for initiating flow of air from the other air slot before said conformal coating material is extruded and for ceasing flow of air from said other air slot before extrusion of said conformal coating material ceases.

3. Apparatus for producing a conformal coating for application to non-uniform substrates having varied surface contours, said apparatus comprising:

a slot nozzle having an elongated slot outlet through which a conformal coating material can be extruded;

a valve for starting and stopping a flow of said conformal coating material to said slot nozzle to produce discrete conformal coatings;

at least one air slot proximate said elongated slot outlet for impinging at least one air stream onto said conformal coating material exuding horizontally from said elongated slot outlet and for carrying said conformal coating material in a film to a non-uniform substrate surface;

a valve for starting the flow of air prior to extrusion of said conformal coating material from said elongated slot outlet, and further including a shim in said slot nozzle, extending at least to said elongated slot outlet, for dividing said elongated slot outlet into a plurality of slot outlets from which said conformal coating material is extruded.

4. Apparatus as in claim 3 wherein said shim has a plurality of juxtaposed elongated projections defining slots therebetween, said projections having tapered ends terminating at the elongated slot outlet of said slot nozzle.

5. Apparatus as in claim 4 wherein the distance between two of the juxtaposed elongated projections is about twice the thickness of said shim.

6. Apparatus as in claim 3 wherein said dividing shim extends outwardly beyond said elongated slot outlet.

7. Apparatus as in claim 6 wherein said shim has a plurality of elongated juxtaposed projections defining slots therebetween, said projections having ends tapered to a point extending beyond the elongated slot outlet of said slot nozzle.

8. Apparatus for producing a conformal coating for application to non-uniform substrates having varied surface contours, said apparatus comprising;

a slot nozzle having an elongated slot outlet through which a conformal coating material can be extruded;

a valve for starting and stopping a flow of said conformal coating material to said slot nozzle to produce discrete conformal coatings;

at least one air slot proximate said elongated slot outlet for impinging at least one air stream onto said conformal coating material exuding horizontally from said elongated slot outlet and for carrying said conformal coating material in a film to a non-uniform substrate surface; and a valve for starting the flow of air prior to extrusion of said conformal coating material from said elongated slot outlet wherein said slot nozzle has an extrusion channel terminating in said elongated slot outlet disposed along said channel and through which said conformal coating material moving through said channel is extruded; and means in said channel, extending at least to said elongated slot outlet, for dividing said elongated slot outlet into a plurality of elongated slot outlets from which said conformal coating material exudes;

wherein said conformal coating material extruding from each said elongated slot outlet merges into said conformal coating material extruding from adjacent elongated slot outlets to form a continuous coating web prior to impingement of air thereon.

9. Apparatus for producing a conformal coating for application to non-uniform substrates having varied surface contours, said apparatus comprising;

a slot nozzle having an elongated slot outlet through which a conformal coating material can be extruded;

a valve for starting and stopping a flow of said conformal coating material to said slot nozzle to produce discrete conformal coatings;

at least one air slot proximate said elongated slot outlet for impinging at least one air stream onto said conformal coating material exuding horizontally from said elongated slot outlet and for carrying said conformal coating material in a film to a non-uniform substrate surface;

a valve for starting the flow of air prior to extrusion of said conformal coating material from said elongated slot outlet wherein said slot nozzle comprises a slot nozzle die having die faces defining an elongated channel for receiving and passing said conformal coating material therethrough;

said elongated channel terminating in said elongated slot outlet;

a shim disposed between said die faces in said channel, said shim having a plurality of elongated projections defining slots therebetween, said projections extending to said elongated slot outlet and defining between them at the ends of said slots defined by said projections a plurality of slot outlets through which said conformal coating material is extruded in a plurality of separate streams which merge to form said film of said conformal coating material.

* * * * *